(12) United States Patent
Woo et al.

(10) Patent No.: US 10,763,149 B2
(45) Date of Patent: Sep. 1, 2020

(54) WAFER STORAGE CONTAINER

(71) Applicant: Bum Je Woo, Seongnam (KR)

(72) Inventors: Bum Je Woo, Seongnam (KR); Young Chul Kim, Yongin (KR)

(73) Assignee: Bum Je Woo, Seongnam (KR)

( * ) Notice: Subject to any disclaimer, the term of this patent is extended or adjusted under 35 U.S.C. 154(b) by 85 days.

(21) Appl. No.: 16/226,240

(22) Filed: Dec. 19, 2018

(65) Prior Publication Data

US 2019/0206708 A1    Jul. 4, 2019

(30) Foreign Application Priority Data

Dec. 28, 2017 (KR) .................. 10-2017-0182317

(51) Int. Cl.
| | | |
|---|---|---|
| *H01L 21/673* | (2006.01) | |
| *B65D 85/48* | (2006.01) | |
| *H01L 21/48* | (2006.01) | |
| *H01L 21/02* | (2006.01) | |
| *H01L 21/67* | (2006.01) | |

(52) U.S. Cl.
CPC .. *H01L 21/67389* (2013.01); *H01L 21/02041* (2013.01); *H01L 21/4817* (2013.01); *H01L 21/67017* (2013.01); *H01L 21/6732* (2013.01); *H01L 21/67383* (2013.01); *H01L 21/67386* (2013.01); *H01L 21/67393* (2013.01)

(58) Field of Classification Search
CPC ......... H01L 21/68389; H01L 21/02041; H01L 21/4817; H01L 21/67017; H01L 21/6732; H01L 21/67383; H01L 21/67386; H01L 21/67393; H01L 21/67769
USPC ................................ 206/454, 710, 711, 832
See application file for complete search history.

(56) References Cited

U.S. PATENT DOCUMENTS

| | | | | |
|---|---|---|---|---|
| 7,059,473 | B2 * | 6/2006 | Watanabe | B65D 5/509 206/453 |
| 2015/0206780 | A1 * | 7/2015 | Choi | H01L 21/67017 206/710 |
| 2015/0357218 | A1 * | 12/2015 | Lin | H01L 21/67393 137/574 |
| 2016/0118282 | A1 * | 4/2016 | Maraschin | H01L 21/67393 414/222.07 |
| 2017/0213752 | A1 * | 7/2017 | Ogawa | H01L 21/67393 |

FOREIGN PATENT DOCUMENTS

| | | |
|---|---|---|
| JP | 2017005082 A | 1/2017 |
| KR | 101100284 B1 | 12/2011 |
| KR | 20150045083 A | 4/2015 |
| KR | 101637498 B1 | 7/2016 |

* cited by examiner

*Primary Examiner* — Luan K Bui

(57) ABSTRACT

The present invention relates generally to a wafer storage container, in which purge gas is supplied to a wafer stored in a storage chamber to remove fumes of the wafer or to remove moisture from the wafer, and more particularly, to a wafer storage container, in which it is possible to ensure easy injection of purge gas into a storage chamber and durability of an injection member, and it is possible to easily replace an injection member.

6 Claims, 16 Drawing Sheets

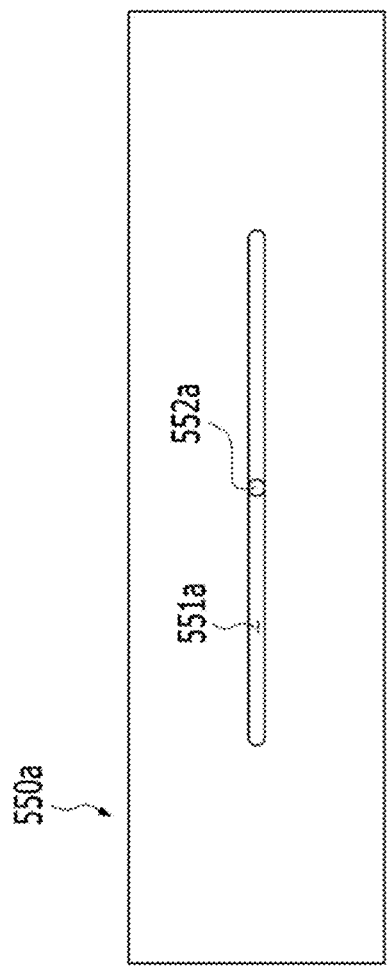

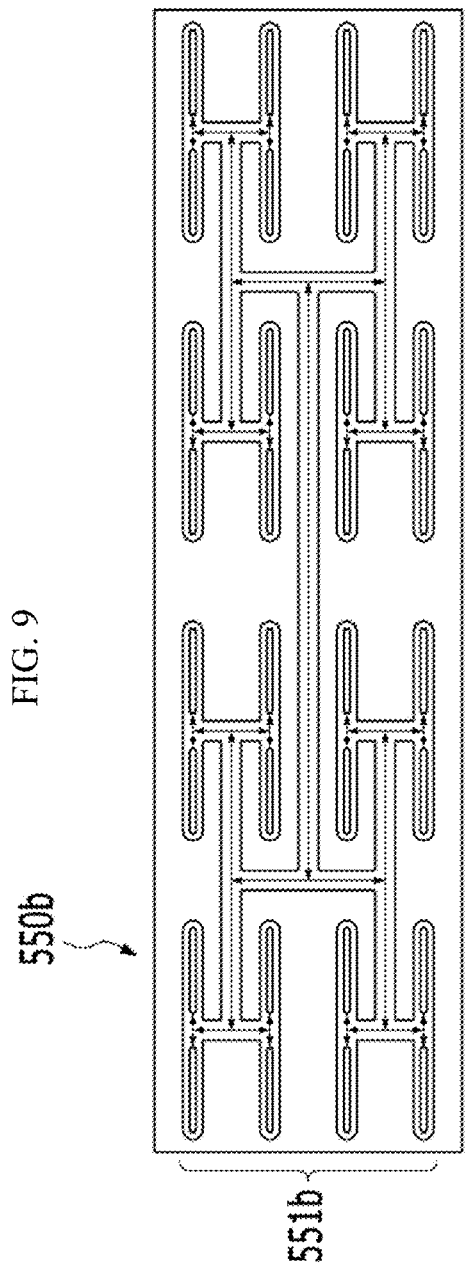

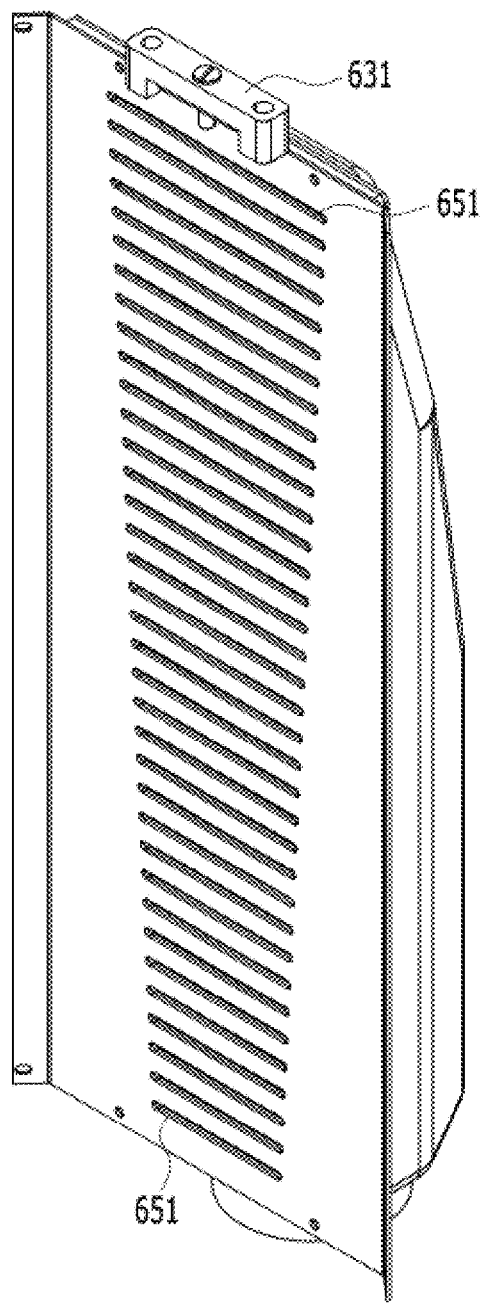

WAFER STORAGE CONTAINER

CROSS REFERENCE TO RELATED APPLICATION

The present application claims priority to Korean Patent Application No. 10-2017-0182317, filed Dec. 28, 2017, the entire contents of which is incorporated herein for all purposes by this reference.

BACKGROUND OF THE INVENTION

Field of the Invention

The present invention relates generally to a wafer storage container. More particularly, the present invention relates to a wafer storage container, in which purge gas is supplied to a wafer stored in a storage chamber to remove fumes of the wafer or to remove moisture from the wafer.

Description of the Related Art

Generally, semiconductor devices are manufactured by selectively and repeatedly performing processes such as a deposition process, a polishing process, a photolithography process, an etching process, an ion implantation process, a cleaning process, an inspection process, a heat treatment process, and the like; and the wafers are transported to a specific locations required in each process in order to be formed as semiconductor devices.

A wafer is a high-precision article that is stored or transported in a wafer storage container such as a front opening unified pod (FOUP) to prevent contamination or damage from external contaminants and shocks.

In this case, process gas used during the processing and fumes as byproducts in the processes, are not removed, but remain on the surfaces of the wafers. As a result, contamination of semiconductor manufacturing equipment during the process may occur, or the reliability of the wafer may be deteriorated due to a poor etch pattern of the wafer, or the like.

Recently, to solve the above problem, purging techniques have been developed to supply purge gas to the wafer housed in the wafer storage container in order to remove residual fumes on the wafer surface, or in order to prevent oxidation of the wafer.

As described above, a wafer storage container capable of supplying purge gas is disclosed in the document of Korean Patent No. 10-1637498 (hereinafter, referred to as 'patent document 1').

The wafer storage container of patent document 1 includes: a storage chamber in which a wafer is stored; a first gas injection chamber communicating with the storage chamber; a first separating wall configured to separate the storage chamber and the first gas injection chamber into separate spaces independent from each other, and provided with a plurality of first holes through which gas is communicated; a second gas injection chamber communicating with the storage chamber; a second separating wall configured to separate the storage chamber and the second gas injection chamber into separate spaces independent from each other, and provided with a plurality of second holes through which gas is communicated; a gas exhausting chamber communicating with the storage chamber; a third separating wall configured to separate the storage chamber and the gas exhausting chamber into separate spaces independent from each other, and provided with a plurality of third holes through which gas is communicated; and a plurality of plates configured to support the wafer.

Accordingly, the gases flowed in the first and second gas injection chambers are injected into the storage chamber through the first holes and the second holes, respectively, and are exhausted to the gas exhausting chamber through the third holes along with fumes remaining on the surface of the wafer, whereby fume removal of the wafer can be achieved.

In the case of the wafer storage container of patent document 1, to facilitate the installation of the first to third separating walls and to ensure the durability of the first to third separating walls, the thicknesses of the first to third separating walls must be thicker than a predetermined thickness. However, when the thickness of the separating wall is formed to be thicker than a predetermined thickness, the first to third holes formed in the first to third separating walls become deep, which increases the flow distance of the purge gas in the holes, so that the injection of the purge gas through the first to third holes cannot be performed properly.

As described above, as the injection of the purge gas through the first to third holes is not performed properly, a dead zone is created in the storage chamber where purging does not occur, and as a result, it is impossible to evenly remove the fumes of the wafers stored in the storage chamber.

Further, when contamination occurs in a part of any one of the first to third separating walls, all the separating walls must be completely replaced, and thus, maintenance cost of the wafer storage container may be increased.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-1637498

SUMMARY OF THE INVENTION

Accordingly, the present invention has been made keeping in mind the above problems occurring in the related art, and it is a first object of the present invention to provide a wafer storage container, in which purge gas can be easily injected into a storage chamber, durability of an injection member is ensured, and the injection member can be easily replaced.

In order to accomplish the above object, according to an aspect of the present invention, there is provided a wafer storage container including: a storage chamber configured such that a wafer is stored therein through a front opening; and an injection member provided on at least a part of a circumferential surface of the storage chamber to inject purge gas into the storage chamber, wherein the injection member includes: an inlet plate provided with an internal flow path with the purge gas introduced therein; a wall plate coupled to a first side of the inlet plate; and a plurality of injection plates coupled to a first side of the wall plate, and provided with injection holes to inject the purge gas supplied from the internal flow path into the storage chamber, wherein the wall plate includes: a wall portion constituting at least a part of the circumferential surface of the storage chamber; and a seat portion formed recessed toward a second side of the wall portion, wherein the plurality of injection plates are seated in and coupled to the seat portion.

Further, the plurality of injection plates may be seated in the seat portion to be arranged on top of each other.

Further, a recess depth of the seat portion may be equal to a thickness of the injection plate.

Further, wherein each of the plurality of injection plates may be configured such that a first injection plate coupled to a first side of the seat portion and provided with a first side flow path through which the purge gas supplied from the internal flow path flows, and a second injection plate coupled to a first side of the first injection plate and formed with the injection holes communicating with the internal flow path are coupled to each other.

Further, the inlet plate may be provided with an inlet portion protruding toward the first side of the inlet plate, the inlet portion may be provided with an inlet hole communicating with the internal flow path, and the inlet portion may be inserted into an inlet portion hole formed in the seat portion.

Further, the inlet plate may be provided with a heater to heat the purge gas flowing through the internal flow path.

The wafer storage container according to the present invention configured as described above has the following advantageous effects.

Since the wall portion and the injection holes of the injection member are separately formed, even if the thickness of the wall portion is increased, the hole depth of the injection holes is not affected. Accordingly, it is possible to improve the durability more than that of the conventional wafer storage container, and simultaneously, it is possible to solve the problem of the lowering of the injection velocity and the uniform injection of the purge gas occurring in the conventional wafer storage container.

Since it is configured such that the plurality of injection plates is coupled to the injection member, only the damaged or contaminated injection plate is required to be replaced, thereby improving the maintenance efficiency.

Since through the structure of the flow path of the injection member, the flow velocity of the purge gas supplied from the external supply unit can be maintained more than the chamber-type injection member of the conventional wafer storage container, and the injection velocity of the purge gas injected from the injection holes becomes higher, and accordingly, it is possible to minimize the occurrence of the dead zone within the storage chamber.

Purging into the lower area, the middle area, and the upper area inside the storage chamber can be individually controlled.

Since the flow rate of the purge gas injected through the injection holes of the injection member is uniform, turbulence in the storage chamber due to uneven injection of purge gas can be prevented, and thus, it possible to smoothly form the airflow inside the storage chamber.

As the positions and opening areas of the injection holes are modified depending on the position of the injection member disposed in the wafer storage container, an optimized purge gas flow within the storage chamber can be achieved, and as a result, it is possible to efficiently prevent occurrence of the dead zone.

By selectively blocking the exhaust of the exhaust member, it is possible to achieve fume removal of the wafer by injecting the purge gas into the storage chamber and exhausting the purge gas and fumes, or it is possible to achieve humidity control inside storage chamber by filling the purge gas inside the storage chamber.

BRIEF DESCRIPTION OF THE DRAWINGS

The above and other objects, features and other advantages of the present invention will be more clearly understood from the following detailed description when taken in conjunction with the accompanying drawings, in which:

FIG. 7 is a view showing a front surface of a first injection plate of FIG. 6;

FIG. 9 is a view showing a flow of purge gas flowing through the second injection plate of FIG. 8B;

FIG. 10 is a perspective view showing an exhaust member of FIG. 1;

DETAILED DESCRIPTION OF THE INVENTION

Figure 1:
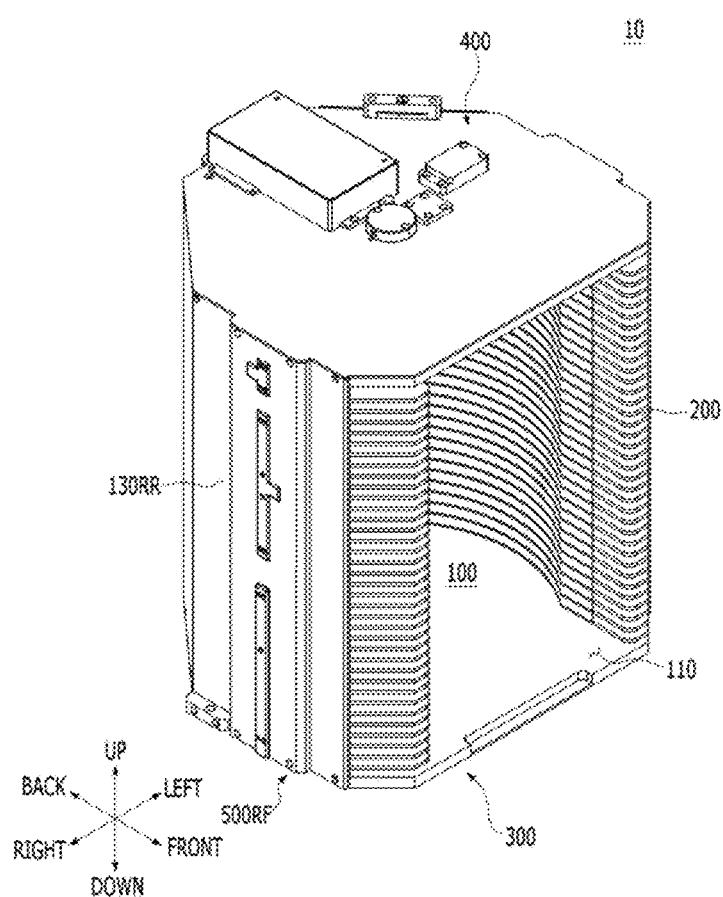
FIG. 1 is a perspective view showing a wafer storage container according to a preferred embodiment of the present invention.

The following description merely illustrates the principles of the invention. Therefore, those skilled in the art will be able to invent various devices included in the concept and scope of the invention, even if not explicitly described or illustrated herein. It should be further understood that all conditional terms and embodiments listed in this specification are, in principle, explicitly intended only for the purpose of enabling the inventive concept to be understood, and are not limited to the specifically listed embodiments and conditions.

The above objects, features and advantages will become more apparent from the following detailed description taken in conjunction with the accompanying drawings, and thus, those skilled in the art will be able to easily carry out the technical concept of the invention.

The embodiments described herein will be described with reference to sectional and/or perspective views that are ideal exemplary views of the present invention. Accordingly, the embodiments of the present invention should not be construed as being limited to the particular shapes shown in the drawings, but should include variations in shape resulting from manufacturing.

'Purge gas' referred to below is a term collectively referring to an inert gas for removing fumes of a wafer, and in particular, may be a nitrogen (N2) gas which is one of the inert gases.

Further, 'purging' is a term collectively referring to the prevention of oxidation of a wafer by injecting purge gas to the wafer to remove residual fumes on the wafer surface or by removing moisture from the inside of the storage chamber.

A wafer storage container according to a preferred embodiment of the present invention includes: a storage chamber configured such that a wafer is stored therein through a front opening; a support provided inside the storage chamber to support the wafer; a bottom plate constituting a bottom surface of the wafer storage container; a top plate constituting a top surface of the wafer storage container; an injection member provided on at least a part of a circumferential surface of the storage chamber to inject purge gas into the storage chamber; and an exhaust member provided on the remaining surface of the circumferential surface of the storage chamber, on which the injection member is not provided, to exhaust the purge gas.

The front opening is formed at the front of the storage chamber, and the wafer is put in and taken out from the storage chamber through the front opening.

The support is provided inside the storage chamber to support the wafer, and the wafer is stored in the support through the front opening formed at the front of the storage chamber.

The top plate and the bottom plate constitute the top surface and the bottom surface of the wafer storage container, respectively. Accordingly, the top surface and the bottom surface of the storage chamber are blocked by the top plate and the bottom plate.

The bottom plate is formed with a supply hole, and a supply flow path communicating with the supply hole, wherein when the external purge gas is supplied through the supply hole and flows in the bottom plate, the introduced purge gas flows to the injection member through the supply flow path.

The injection member is disposed on at least a part of the circumferential surface of the storage chamber in which the wafer is stored, and serves to inject the purge gas introduced from the supply flow path formed in the bottom plate into the storage chamber.

The injection member includes: a communication hole communicating with the supply flow path of the bottom plate; an inlet plate provided with an internal flow path configured to communicate with the communication hole with the purge gas introduced therein; a wall plate coupled to a first side of the inlet plate; and a plurality of injection plates coupled to a first side of the wall plate, and provided with injection holes to inject the purge gas supplied from the internal flow path into the storage chamber.

The wall plate includes: a wall portion constituting at least a part of the circumferential surface of the storage chamber; and a seat portion formed recessed toward a second side of the wall portion.

The plurality of injection plates are seated in and coupled to the seat portion.

The exhaust member is disposed on the remaining surface of the circumferential surface of the storage chamber, on which the injection member is not provided, that is, on the remaining surface except the at least a part of the circumferential surface, and serves to exhaust the purge gas injected into the storage chamber and fumes of the wafer.

As such, as the wafer storage container is provided with the injection member for injecting the purge gas into the storage chamber, and the exhaust member for exhausting the purge gas, fume removal and humidity control of the wafer stored in the storage chamber can be achieved.

In other words, the injection member injects the purge gas into the storage chamber, and the exhaust member exhausts the purge gas injected into the storage chamber by the injection member and the fumes of the wafer, whereby fume removal of the wafer can be achieved, or after the exhaust is not performed by the exhaust member, the injection member injects the purge gas into the storage chamber, whereby humidity control of the wafer can be achieved.

The injection member and the exhaust member may be provided in plural depending on the size, purpose, etc. of the wafer storage container.

For example, in the case where the storage chamber is provided with the front opening and the circumferential surface of the storage chamber is constituted by a left front surface, a left rear surface, a middle rear surface, a right rear surface, and a right front surface in the order from left to right, the plurality of injection members may be constituted by a left front injection member disposed on the left front surface of the circumferential surface of the storage chamber, a right front injection member disposed on the right front surface of the circumferential surface of the storage chamber, and a middle rear injection member disposed on the middle rear surface of the circumferential surface of the storage chamber.

Further, the plurality of exhaust members may be disposed on the left rear surface and the right rear surface of the circumferential surface of the storage chamber, where the injection members are not disposed.

Hereinbelow, as an embodiment of a wafer storage container 10 according to the preferred embodiment of the present invention, it will be described on the basis that the wafer storage container 10 is configured such that a plurality of injection members 500 is constituted by a left front injection member 500LF, a right front injection member 500RF, and a middle rear injection member 500MR disposed on a left front surface, a right front surface, a middle rear surface of the circumferential surface of a storage chamber 100, respectively, and an exhaust member 600, which is a single exhaust member 600, is disposed on a left rear surface of the circumferential surface of a storage chamber 100 where the injection members 500 are not disposed.

In this case, the left front injection member 500LF means that the injection member 500 is disposed at the left front, the right front injection member 500RF means that the injection member 500 is disposed at the right front, and the middle rear injection member 500MR means that the injection member 500 is disposed at the middle rear.

In other words, the left front injection member 500LF, the right front injection member 500RF, and the middle rear injection member 500MR are different from each other only in their placement and the configurations thereof are identical. Accordingly, in the following description, the left front injection member 500LF is used as a reference, and the redundant description in the remaining right front injection member 500RF and the middle rear injection member 500MR supersedes that of the left front injection member 500LF.

Further, as described above, the placement positions of the left front injection member 500LF, the right front injection member 500RF, and the middle rear injection member 500MR are specified for ease of description, but regardless of the above terms, all may be understood as the term injection member 500.

Further, for convenience of description, the flow paths and holes corresponding to the lower area, the middle area, and the upper area shown in the following description are described by attaching 'B (BOTTOM), M (MIDDLE), and T (TOP). Accordingly, in the drawings, the reference numerals not showing 'B, M, and T' can be understood as channels and holes corresponding to the lower area, the middle area, and the upper area, respectively, as described above.

Wafer Storage Container 10 According to the Preferred Embodiment of the Present Invention Hereinbelow, reference will be made to the wafer storage container 10 according to the preferred embodiment of the present invention with reference to FIGS. 1 to 12.

Figure 2:
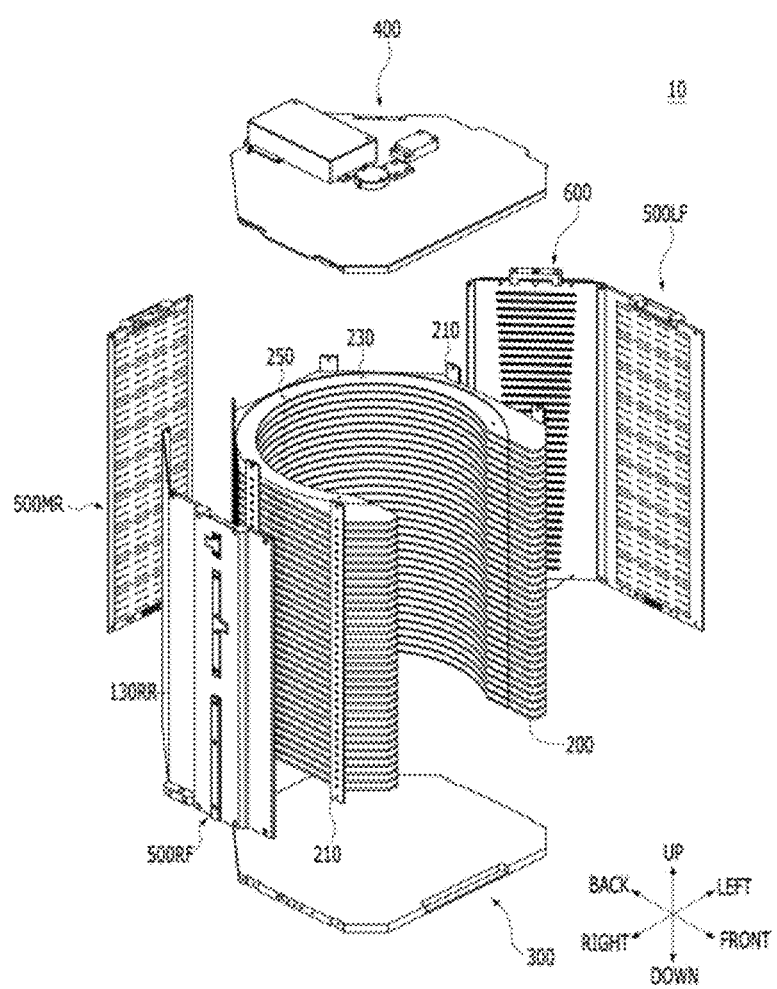
FIG. 2 is an exploded perspective view of FIG. 1.
Figure 3:
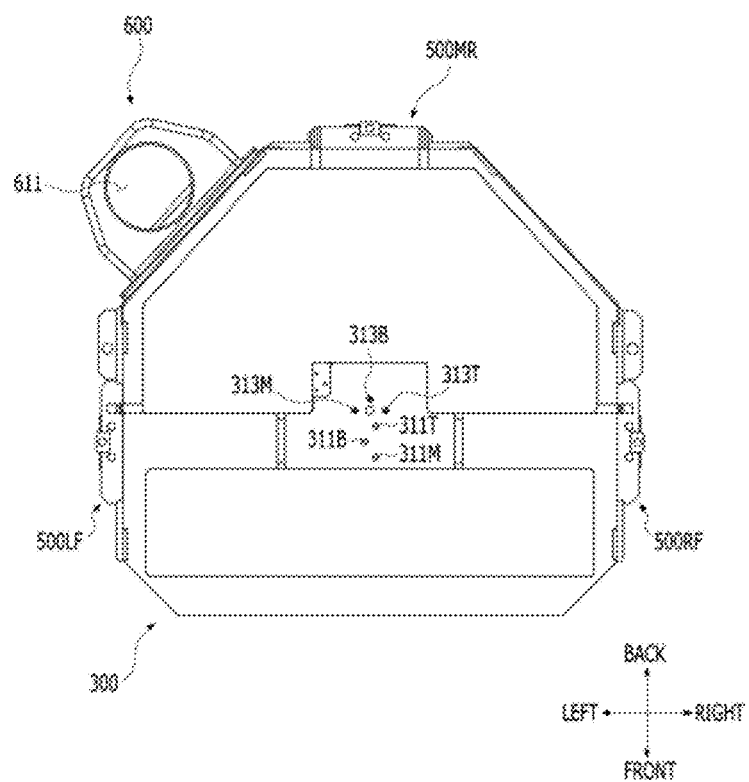
FIG. 3 is a bottom view of FIG. 1.
Figure 4:
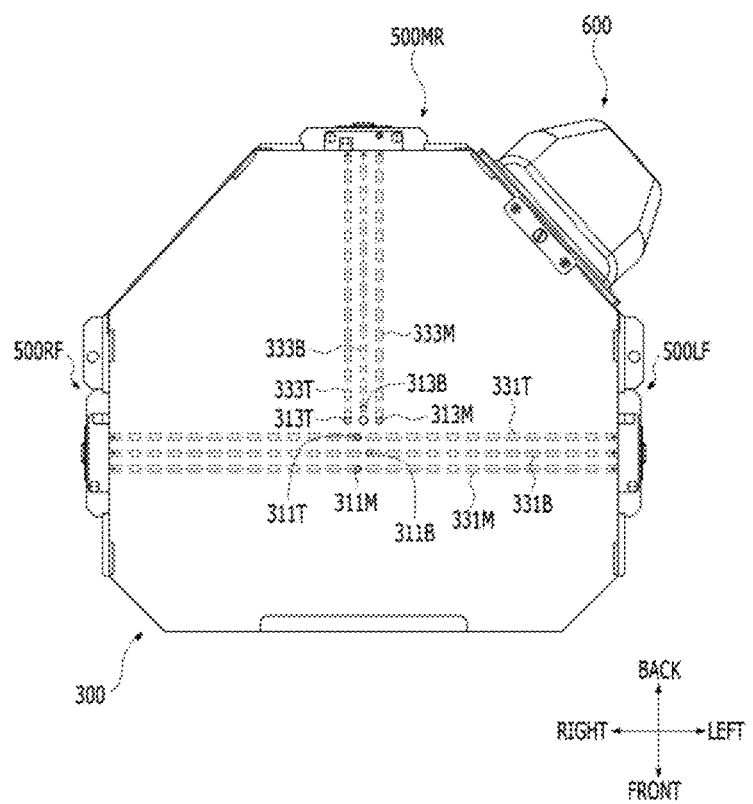
FIG. 4 is a view showing a flow of purge gas flowing from a bottom plate of FIG. 1 to injection members.
Figure 5:
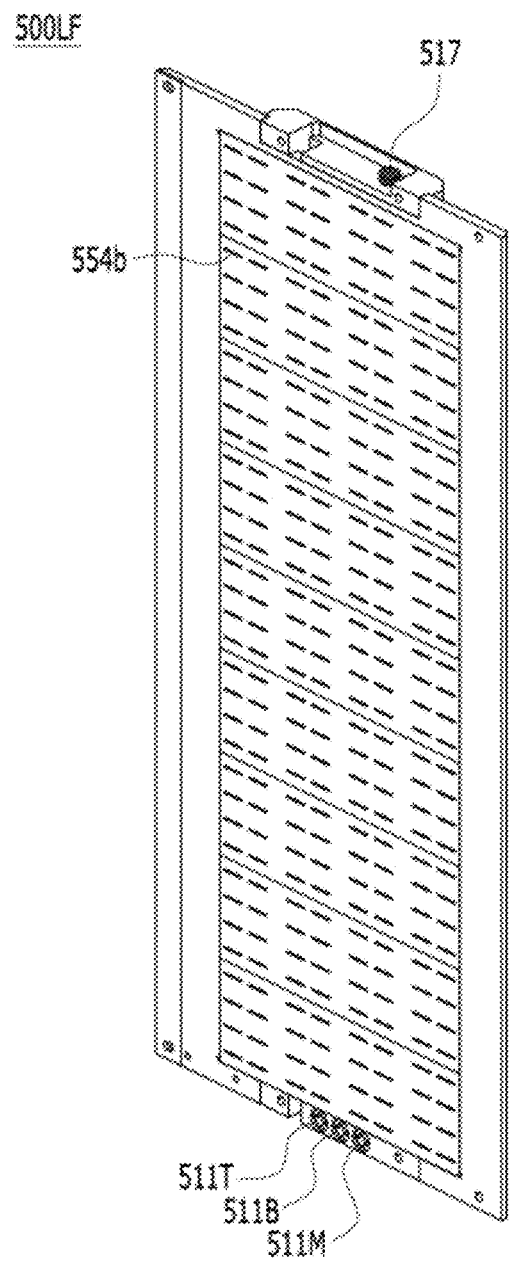
FIG. 5 is a perspective view showing a left front injection member of FIG. 1.
Figure 6:
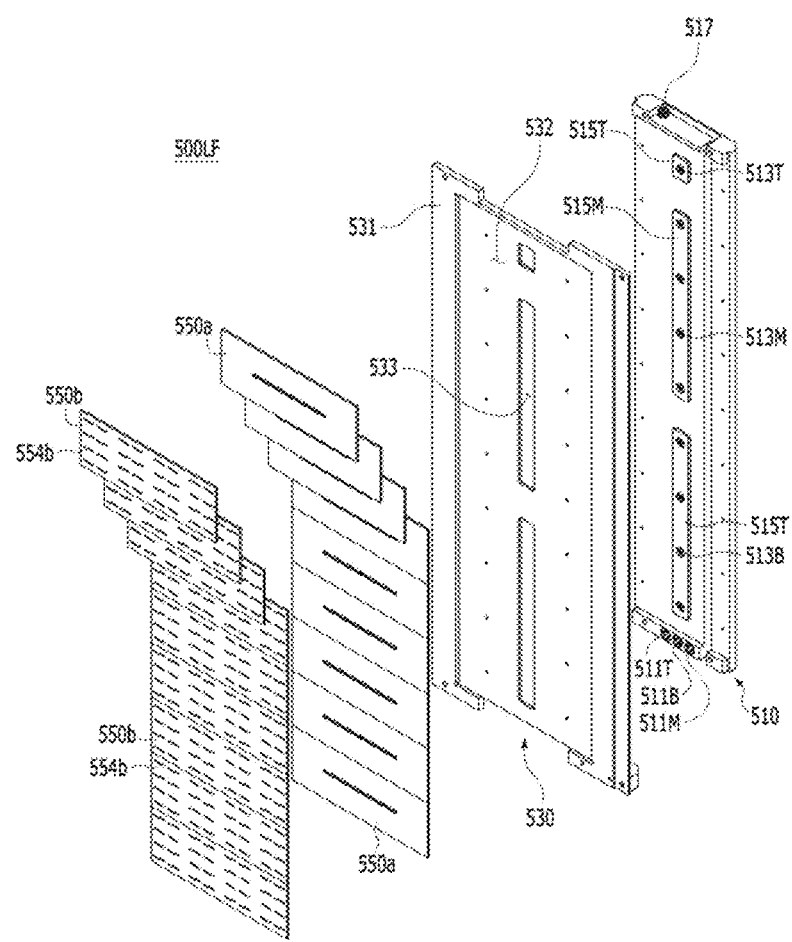
FIG. 6 is an exploded perspective view of FIG. 5.
Figure 8A:
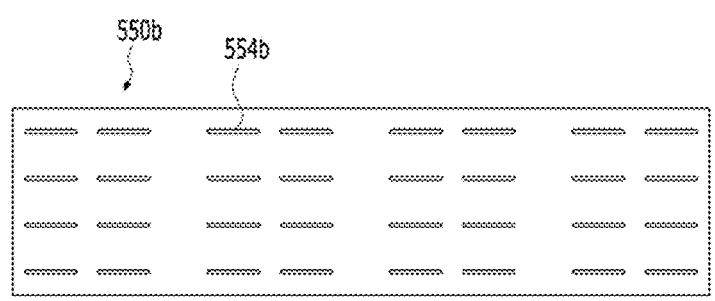
FIG. 8A is a view showing a front surface of a second injection plate of FIG. 6.
Figure 8B:
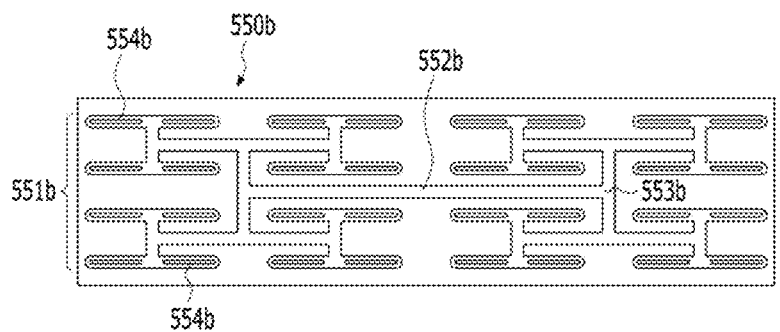
FIG. 8B is a view showing a rear surface of the second injection plate of FIG. 6.
Figure 11:
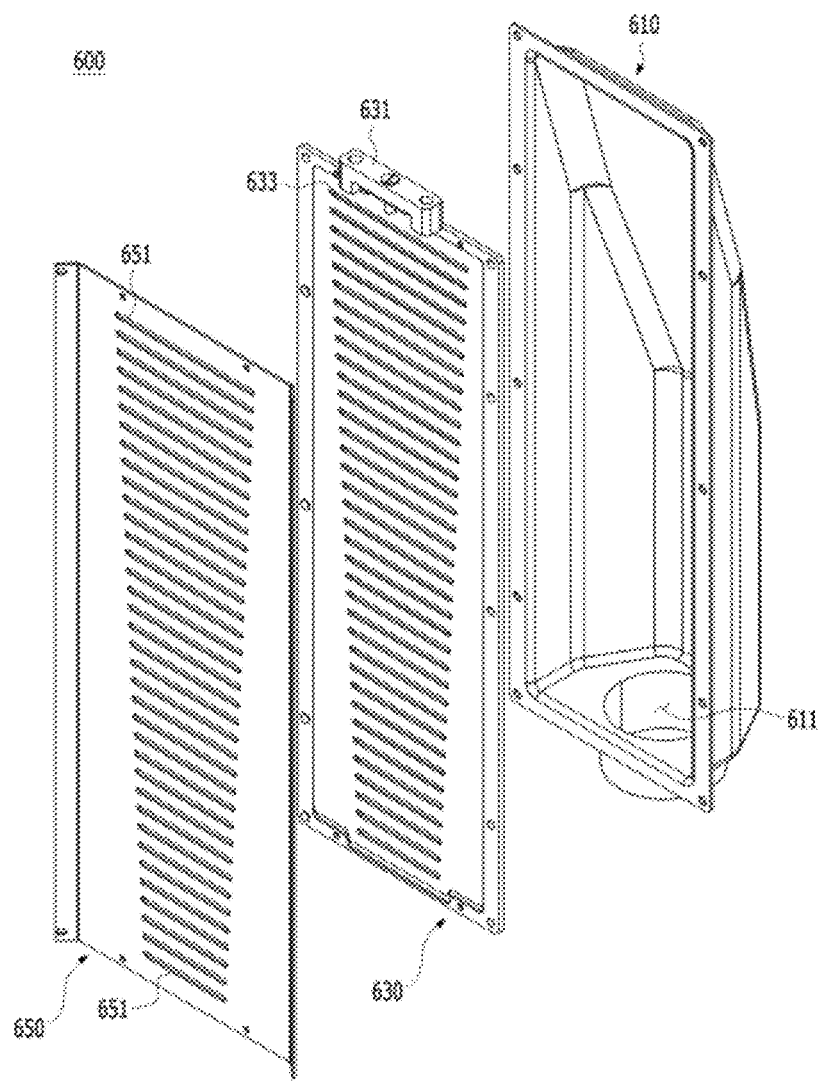
FIG. 11 is an exploded perspective view of FIG. 10.
Figure 12:
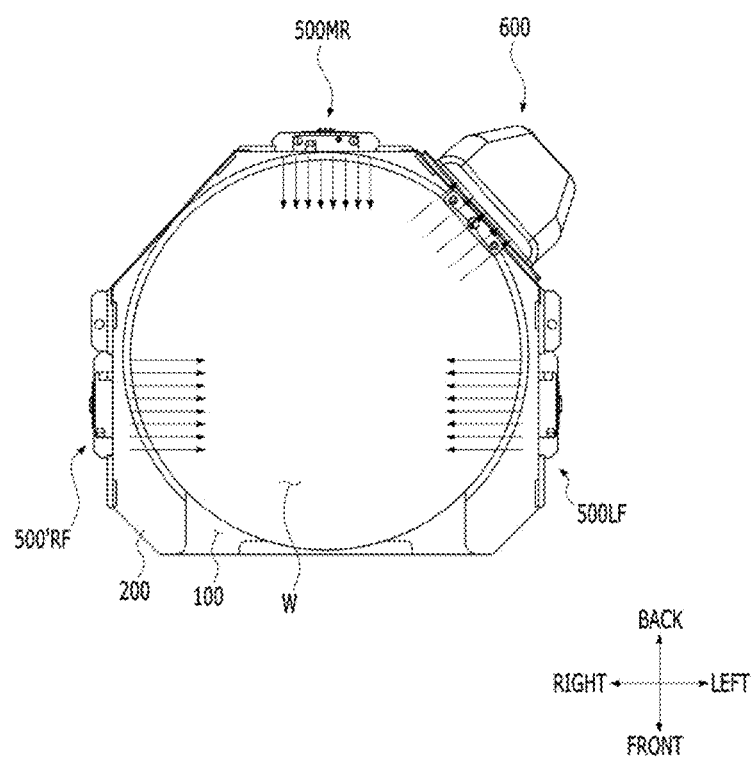
FIG. 12 is a view showing a flow of purge gas injected to a wafer supported by a support of FIG. 1, and a flow of purge gas and fumes exhausted to the exhaust member.

FIG. 1 is a perspective view showing a wafer storage container according to a preferred embodiment of the present invention; FIG. 2 is an exploded perspective view of FIG. 1; FIG. 3 is a bottom view of FIG. 1; FIG. 4 is a view showing a flow of purge gas flowing from a bottom plate of FIG. 1 to injection members; FIG. 5 is a perspective view showing a left front injection member of FIG. 1; FIG. 6 is an exploded perspective view of FIG. 5; FIG. 7 is a view showing a front surface of a first injection plate of FIG. 6; FIG. 8A is a view showing a front surface of a second injection plate of FIG. 6; FIG. 8B is a view showing a rear surface of the second injection plate of FIG. 6; FIG. 9 is a view showing a flow of purge gas flowing through the second injection plate of FIG. 8B; FIG. 10 is a perspective view showing an exhaust member of FIG. 1; FIG. 11 is an exploded perspective view of FIG. 10; and FIG. 12 is a view showing a flow of purge gas injected to a wafer supported by a support of FIG. 1, and a flow of purge gas and fumes exhausted to the exhaust member.

As shown in FIGS. 1 to 3, the wafer storage container 10 according to the preferred embodiment of the present invention includes: a storage chamber 100 configured such that a wafer W is stored therein through a front opening 110; a support 200 provided inside the storage chamber 100 to support the wafer W; a bottom plate 300 constituting a bottom surface of the wafer storage container 10; a top plate 400 constituting a top surface of the wafer storage container 10; a left front injection member 500LF disposed on the left front surface of the circumferential surface of the storage chamber 100 to inject purge gas into the storage chamber 100; a right front injection member 500RF disposed on the right front surface of the circumferential surface of the storage chamber 100 to inject purge gas into the storage chamber 100; a middle rear injection member 500MR disposed on the middle rear surface of the circumferential surface of the storage chamber 100 to inject purge gas into the storage chamber 100; and an exhaust member 600 disposed on the left rear surface of the circumferential surface of the storage chamber 100, on which the injection member 500 is not provided, to exhaust the purge gas of the storage chamber 100 and fumes of the wafer W.

Storage Chamber 100

Hereinbelow, reference will be made to the storage chamber 100.

As shown in FIGS. 1 and 12, the storage chamber 100 serves to store the wafer W therein, and is defined as an internal space surrounded by the circumferential surface on which the left front injection member 500LF, the right front injection member 500RF, the middle rear injection member 500MR, the right rear wall 130RR, and the exhaust member 600 are disposed.

At the front of the storage chamber 100, the front opening 110 is formed, and the wafer W is put in and taken out from the front opening 110.

The top surface of the storage chamber 100 is constituted by the top plate 400, the bottom surface of the storage chamber 100 is constituted by the bottom plate 300, and the circumferential surface of the storage chamber 100 is constituted by the left front surface, the left rear surface, the middle rear surface, the right rear surface, and the right front surface in the order from left to right.

In this case, the left front injection member 500LF is disposed on the left front surface, the exhaust member 600 is disposed on the left rear surface, the middle rear injection member 500MR is disposed on the middle rear surface, the right rear wall 130RR is disposed on the right rear surface, and the right front injection member 500RF is disposed on the right front surface.

Accordingly, except the front opening 110, the top surface, the bottom surface, and the circumferential surface of the storage chamber 100 are blocked by the top plate 400, the bottom plate 300, the left front injection member 500LF, the right front injection member 500RF, the exhaust member 600, the right rear wall 130RR, and the middle rear injection member 500MR.

Accordingly, as shown in FIG. 12, the purge gas is injected from the left front surface, the right front surface, and the middle rear surface of the storage chamber 100, on which the left front injection member 500LF, the right rear injection member 500, and the middle rear injection member 500MR are disposed, into the storage chamber 100, and the purge gas injected into the storage chamber 100 and the fumes of the wafer W are exhausted through the exhaust member 600 disposed on the left rear surface of the storage chamber 100.

Support 200

As shown in FIGS. 1, 2, and 12, the storage chamber 100 is provided therein with the support 200 for supporting the wafer W.

The support 200 is provided in plural in a vertical direction according to the number of wafers W accommodated in the storage chamber 100.

For example, when 30 wafers W are stored in the storage chamber 100, 30 supports 200 are provided to support the 30 wafers W, respectively.

The multiple supports 200 described above are locked to the left front surface, the left rear surface, the right front surface, and the right rear surface of the storage chamber 100 by support coupling members 210.

Further, the support 200 is provided with a step 230 stepped downwardly to be overlapped with a part of the wafer W in the outward direction, and the step 230 is provided with three protruding pins 250. Accordingly, the wafer W is supported by the support 200 by being mounted on the protruding pins 250.

As described above, as the wafer W is supported by the support 200 by being mounted on the protruding pins 250, the contact area between the wafer W and the support 200 can be minimized, which can minimize the damage of the wafer W due to the contact.

Bottom Plate 300 and Top Plate 400

Hereinbelow, reference will be made to the bottom plate 300 and the top plate 400.

As shown in FIGS. 1 to 4, the bottom plate 300 constitutes the bottom surface of the wafer storage container 10, and blocks the lower portion of the storage chamber 100, and simultaneously serves to cause the purge gas supplied from outside the wafer storage container 10 to flow to the left front injection member 500LF, the right front injection member 500RF, and the middle rear injection member 500MR through the supply hole formed in the bottom surface, that is, the lower surface of the bottom plate 300, and the supply flow path formed inside the bottom plate 300.

The supply hole 311 serves to introduce the purge gas supplied from outside the wafer storage container 10 into the bottom plate 300.

The supply hole 311 is formed in the bottom surface, that is, the lower surface of the bottom plate 300, and is constituted by a left-right bottom area supply hole 311B, a left-right middle area supply hole 311M, a left-right top area supply hole 311T, a rear bottom area supply hole 313B, a rear middle area supply hole 313M, and a rear top area supply hole 313T depending on whether the purge gas is supplied to the bottom area, that is the vertical area inside the storage chamber 100, the middle area, or the top area.

The supply flow path 331 communicates with the supply hole 311, and serves as a path for the flow of purge gas supplied from outside the wafer storage container 10, that is, the purge gas supplied from an external supply unit (not shown), to the injection member 500.

The supply flow path 331 includes: a left-right bottom area supply flow path 331B, a left-right middle area supply flow path 331M, and a left-right top area supply flow path 331T, which communicate with the left-right bottom area supply hole 311B, the left-right middle area supply hole 311M, and the left-right top area supply hole 311T to cause the purge gas to flow to the left front injection member 500LF and the right front injection member 500RF; and a rear bottom area supply flow path 333B, a rear middle area supply flow path 333M, and a rear top area supply flow path 333T, which communicate with the rear bottom area supply hole 313B, the rear middle area supply hole 313M, and the rear top area supply hole 313T to cause the purge gas to flow to the rear front injection member 500.

In this case, the left-right bottom area supply flow path 331B is configured such that the first end and the second end thereof communicate with the bottom area communication hole 511B of the left front injection member 500LF and the bottom area communication hole 511B of the right front injection member 500RF, respectively; the left-right middle area supply flow path 331M is configured such that the first end and the second end thereof communicate with the middle area communication hole 511M of the left front injection member 500LF and the middle area communication hole 511M of the right front injection member 500RF, respectively; and the left-right top area supply flow path 331T is configured such that the first end and the second end thereof communicate with the top area communication hole 511T of the left front injection member 500LF and the top area communication hole 511T of the right front injection member 500RF, respectively.

Further, the rear bottom area supply flow path 333B is configured such that the first end thereof communicates with the bottom area communication hole 511B of the middle rear injection member 500MR; the rear middle area supply flow path 333M is configured such that the first end thereof communicates with the middle area communication hole 511M of the middle rear injection member 500MR; and the rear top area supply flow path 333T is configured such that the first end thereof communicates with the top area communication hole 511T of the middle rear injection member 500MR.

As shown in FIGS. 1 and 2, the top plate 400 constitutes the top surface of the wafer storage container 10, and serves to block the upper portion of the storage chamber 100. In this case, the overall shape of the top plate 400 is preferably the same as the overall shape of the bottom plate 300.

Injection Member 500

As shown in FIGS. 1 to 4, and 12, the injection member 500 is constituted by the left front injection member 500LF disposed on the left front surface of the circumferential surface of the storage chamber 100, the right front injection member 500RF disposed on the right front surface of the circumferential surface of the storage chamber 100, and the middle rear injection member 500MR disposed on the middle rear surface of the circumferential surface of the storage chamber 100.

The left front injection member 500LF, as shown in FIGS. 5 and 6, includes: an inlet plate 510 provided with a communication hole 511 communicating with the supply flow path 331 of the bottom plate 300, and an internal flow path (not shown) communicating with the communication hole 511 such that the purge gas is introduced therein; a wall plate 530 coupled to a first side of the inlet plate 510; and a plurality of injection plates 550 coupled to a first side of the wall plate 530, and provided with injection holes 554b for injecting the purge gas supplied from the internal flow path into the storage chamber 100.

The lower portion of the inlet plate 510 is formed with the communication hole 511 communicating with the supply flow path 331 of the bottom plate 300.

The communication hole 511 is constituted by the bottom area communication hole 511B communicating with an end of the left-right bottom area supply flow path 331B of the bottom plate 300, the middle area communication hole 511M communicating with an end of the left-right middle area supply flow path 331M, and the top area communication hole 511T communicating with an end of the left-right top area supply flow path 331T.

The inlet plate 510 is formed with an inlet hole 513 communicating with a second side hole 552a of a first injection plate 550a.

The inlet hole 513 is constituted by a bottom area inlet hole 513B communicating with the bottom area communication hole 511B, a middle area inlet hole 513M communicating with the middle area communication hole 511M, and a top area inlet hole 513T communicating with the top area communication hole 511T.

In this case, each communication hole 511 and each inlet hole 513 communicate with each other by the internal flow path (not shown) formed inside the inlet plate 510.

Since the supply of the purge gas to the injection plate 550 is performed by the inlet hole 513, the number of inlet holes 513 is equal to the number of injection plates 550.

As shown in FIGS. 5 and 6, the number of injection plates 550 is nine, so the number of inlet holes 513 is nine, wherein of the nine inlet holes 513, the number of bottom area inlet holes 513B is four, the number of middle area inlet holes 513M is four, and the number of top area inlet holes 513T is one. Of course, the number of injection plates 550, and the number of inlet holes 513, that is the number of bottom area inlet hole 513B, middle area inlet hole 513M, and top area inlet hole 513T are only an example, and may vary depending on the use and size of the wafer storage container 10.

The inlet plate 510 is formed with an inlet portion 515 protruding toward the first side of the inlet plate 510. The inlet portion 515 is provided with the inlet hole 513 communicating with the internal flow path.

In this case, the inlet portion 515 may be constituted by a bottom area inlet portion 515B, a middle area inlet portion 515M, and a top area inlet portion 515T, wherein the bottom area inlet holes 513B are arranged in the longitudinal direction in the bottom area inlet portion 515B, the middle area inlet holes 513M are arranged in the longitudinal direction in the middle area inlet portion 515M, and the top area inlet holes 513T are arranged in the longitudinal direction in the top area inlet portion 515T.

The inlet portion 515 is inserted into an inlet portion hole 533 of a seat portion 532, thereby coupling the inlet plate 510 and the wall plate 530 together, and aligning the inlet hole 513 (i.e., the bottom area inlet hole 513B, the middle area inlet hole 513M, and the top area inlet hole 513T) with the second side hole 552a of the first injection plate 550a of the injection plate 550.

The inlet plate 510 is provided with a heater 517, wherein the heater 517 functions to raise the temperature by heating the purge gas flowing in the internal flow path, and simultaneously, to heat the interior of the storage chamber 100 to raise the temperature.

In this case, the heater 517 may have a rod shape and may be inserted into the inlet plate 510 so as to be positioned close to the internal flow path.

When the heater 517 generates heat itself, the purge gas flowing in the internal flow path is heated and the temperature of the purge gas rises. As such, as the purge gas is heated, the flow of the purge gas becomes more active and the purge gas can be smoothly injected into the storage chamber 100.

Further, when the heater 517 generates heat itself, the injection member 500 itself is heated, so that the heat is transferred to the inside of the storage chamber 100 and the temperature inside the storage chamber 100 rises. Accordingly, as the internal temperature of the storage chamber 100 rises, the dehumidifying effect of reducing the moisture inside the storage chamber 100 is achieved. As a result, purging of the purge gas and dehumidification of the wafer storage container 10 can be achieved.

The wall plate 530 is coupled to the first side of the inlet plate 510, and includes a wall portion 531 constituting at least a part of the circumferential surface of the storage chamber 100, and a seat portion 532 formed recessed toward a second side of the wall portion 531.

In the case of the left front injection member 500LF, since the left front injection member 500LF is disposed on the left front surface of the circumferential surface of the storage chamber 100, the wall portion 531 of the left front injection member 500LF constitutes the left front wall of the wafer storage container 10.

In the case of the right front injection member 500RF, since the right front injection member 500RF is disposed on the right front surface of the circumferential surface of the storage chamber 100, the wall portion 531 of the right front injection member 500RF constitutes the right front wall of the wafer storage container 10.

In the case of the middle rear injection member 500MR, since the middle rear injection member 500MR is disposed on the middle rear surface of the circumferential surface of the storage chamber 100, the wall portion 531 of the middle rear injection member 500MR constitutes the middle rear wall of the wafer storage container 10.

The seat portion 532 is formed recessed toward the second side of the wall portion 531, and serves to provide a space where the plurality of injection plates 550 is seated.

The recess depth of the seat portion 532, that is, the height of the step of the seat portion 532 is preferably formed to be equal to the thickness of the injection plate 550. As such, as the recess depth of the seat portion 532 and the thickness of the injection plate 550 are formed to be the same, when the injection plate 550 is seated in the seat portion 532, it is possible to prevent the first side of the injection plate 550 from more protruding or being more recessed than the first side of the wall portion 531.

Further, the width of the seat portion 532 is preferably formed to be equal to the width of the injection plate 550, and accordingly, the injection plate 550 can be easily seated in the seat portion 532 and coupled thereto.

The seat portion 532 is formed with the inlet portion hole 533 into which the inlet portion 515 (i.e., the bottom area inlet portion 515B, the middle area inlet portion 515M, and the top area inlet portion 515T) is inserted.

The thickness of the seat portion 532 where the inlet portion hole 533 is formed is preferably formed to be equal to the protruding length of the inlet portion 515 in the first side direction. As such, as the thickness of the seat portion 532 and the protruding length of the inlet portion 515 in the first side direction are formed to be the same, when the inlet portion 515 is inserted into the inlet portion hole 533, it is possible to prevent the first side of the inlet portion 515 from protruding more or being more recessed than the first side of the seat portion 532. Accordingly, the inlet hole 513 disposed in the inlet portion 515 is aligned with the second side hole 552a of the first injection plate 550a so that the communication between the inlet hole 513 and the second side hole 552a can be facilitated.

The injection plate 550 is seated in the first side of the seat portion 532 of the wall plate 530 and coupled thereto, and serves to inject the purge gas supplied from the internal flow path of the inlet plate 510 into the storage chamber 100 through the injection holes 554b provided in the injection plate 550.

The injection plate 550 may be configured, as shown in FIGS. 6 to 9, such that a first injection plate 550a coupled to the first side of the seat portion 532 of the wall plate 530 and formed with the second side hole 552a and the first side flow path 551a through which the purge gas supplied from the internal flow path of the inlet plate 510 flows, and a second injection plate 550b coupled to the first side of the first injection plate 550a and formed with the injection holes 554b communicating with the first side flow path 551a are coupled to each other. In this case, the first injection plate 550a is coupled to the first side of the second injection plate 550b on the second side thereof.

The second side of the first injection plate 550a is seated in the seat portion 532 of the inlet plate 510 and is coupled to the first side of the inlet plate 510, wherein the second side of the first injection plate 550a is formed with the second side hole 552a communicating with the inlet hole 513, and the first side of the first injection plate 550a is formed with the first side flow path 551a communicating with the second side hole 552a.

The second side hole 552a is formed at the center of the second side of the first injection plate 550a, and serves to communicate the inlet hole 513 with the first side flow path 551a. Accordingly, the purge gas introduced in the first injection plate 550a through the inlet hole 513 flows from second side hole 552a to the first side flow path 551a, sequentially.

The first side flow path 551a is formed in the first side of the first injection plate 550a in the lateral direction and communicates with the second side hole 552a by being associated therewith at the center thereof. In other words, the second side hole 552a is located at the center point in the lateral direction of the first side flow path 551a.

The first side flow path 551a serves to communicate the inlet hole 513, the second side hole 552a, and a main flow path 552b of a branch flow path portion 551b of the second injection plate 550b with each other. In this case, for easy communication between the first side flow path 551a and the main flow path 552b, it is preferable that the first side flow path 551a is formed to have the same length, height, and width, that is, the same volume as the main flow path 552b.

As described above, as the first side flow path 551a and the main flow path 552b are formed to have the same length, height, and width, that is, the same volume to correspond to each other, the first side flow path 551a and the main flow path 552b form an injection chamber where the purge gas flows when the first and second injection plates 550a and 550b are coupled to each other to form the injection plate 550.

The second side of the injection plate 550b is coupled to the first injection plate 550a, wherein the second side of the second injection plate 550b is formed with the branch flow path portion 551b, and the first side of the second injection plate 550b is formed with the injection holes 554b communicating with the branch flow path portion 551b.

The branch flow path portion 551b includes the main flow path 552b communicating with the first side flow path 551a of the first injection plate 550a, and a continuous branch flow path 553b configured to be continuously branched from opposite ends of the main flow path 552b.

The continuous branch flow path 553b is configured such that branch flow paths are continuously branched into a 'T' shape, and the overall shape thereof is in a shape where five 'I' are connected to each other (a shape where 'I' shaped flow path continuously communicating with each end of large 'I' shaped branch flow path).

The branch flow paths of the continuous branch flow path 553b are configured such that each branch flow path is branched into a 'T' shape so as to cause the purge gas to diverge and flow in opposite directions.

Of the continuous branch flow path 553b, the area where the purge gas reaches last communicates with the injection holes 554b formed in the first side of the second injection plate 550b.

The injection hole 554b is formed in plural in the first side of the second injection plate 550b.

The positions of the injection holes 554b are formed at positions communicating with the area where the purge gas of the continuous branch flow path 553b of the branch flow path portion 551b reaches last.

In other words, at the area where the purge gas reaches end of the continuous branch flow path 553b, a plurality of injection holes 554b opened in the first side direction of the second injection plate 550b are positioned. Accordingly, the purge gas sequentially flowing through the main flow path 552b and the continuous branch flow path 553b is injected into the storage chamber 100 through the injection holes 554b.

Due to the shape of the branch flow path portion 551b described above, when the purge gas flows from the second side hole 552a of the first injection plate 550a to each of the injection holes 554b of the second injection plate 550b, the flow distances of the purge gas are the same.

Accordingly, the uniform injection of the purge gas into the storage chamber 100 can be performed, thereby suppressing turbulence formation in the storage chamber 100, and thus the purging efficiency of the wafer W of the wafer storage container 10 is greatly improved.

The configuration of the left front injection member 500LF described above is equally applicable to the right front injection member 500RF and the middle rear injection member 500MR.

The injection member 500 configured as described above has the following advantageous effects.

Since the inlet plate 510, the wall plate 530, and the injection plate 550 are coupled to form the injection member 500, the durability of the injection member 500 is guaranteed. At the same time, since the injection holes 554b are formed in the first side of the second injection plate 550b of the injection plate 550, it is possible to minimize the hole depth of the injection holes 554b.

In other words, in a conventional wafer storage container, injection holes are formed in a simple wall, and a chamber formed by the separating walls is configured to inject purge gas through the injection holes, so that the hole depth of the injection holes is required to be deep to secure the durability of the wall. Accordingly, the injection velocity of the purge gas itself may be lowered, or the uniform injection of the purge gas may not be achieved properly.

However, as described above, in the case of the injection member 500 of the wafer storage container 10 according to the preferred embodiment of the present invention, since the injection member 500 is formed by the inlet plate 510, the wall plate 530, and the injection plate 550 coupled to each other, the wall portion 531 of the wall plate 530 and the injection holes 554b are separately formed. Accordingly, even if the thickness of the wall portion 531 is increased, the hole depth of the injection holes 554b is not affected, whereby it is possible to solve the problem of the lowering of the injection velocity and the uniform injection of the purge gas occurring in the conventional wafer storage container.

Further, it is possible to easily replace a contaminated or damaged wall plate 530 or injection plate 550. In particular, since the plurality of injection plates 550 are coupled to each other, when an injection plate 550 is damaged, only the damaged injection plate 550 is required to be replaced, and as the wafer storage container 10 is used for a long time, even if the contamination of the injection plate 550 occurs, only the contaminated injection plate 550 is required to be replaced, thereby improving the maintenance efficiency.

Exhaust Member 600

Hereinbelow, reference will be made to the exhaust member 600.

As shown in FIGS. 2, 5, 6, and 9, the exhaust member 600 is disposed on the left rear surface of the circumferential surface of the storage chamber 100, on which the injection member 500 is not provided, and includes: an exhaust hopper 610 formed with an exhaust hole 611 at the lower portion thereof; an outlet plate 650 coupled to the exhaust hopper 610, and formed with a plurality of outlets 651 communicating with the exhaust hole 611; and a blocking plate 630 interposed between the exhaust hopper 610 and the outlet plate 650, and configured to block the exhaust of the purge gas of the exhaust member 600 and the fumes of the wafer W.

The lower portion of the exhaust hopper 610, that is, the exhaust hopper 610 is formed with the exhaust hole 611 communicating with an external exhaust unit (not shown) of the wafer storage container 10.

The outlet plate 650 is coupled to the front side (left side in FIG. 2) of the exhaust hopper 610 and is formed with the plurality of outlets 651 communicating with the exhaust hole 611.

In this case, the plurality of outlets 651 may be configured such that the opening areas thereof are increased in a direction from the lower portion of the outlet plate 650 toward the upper portion of the outlet plate 650, and as a result, the exhaust of the purge gas and the fumes of the wafer W can be smoothly performed at the upper outlet 651 far from the exhaust hole 611.

The blocking plate 630 is interposed between the exhaust hopper 610 and the outlet plate 650, and is formed with a plurality of exhaust communication holes 633 corresponding to the plurality of outlets 651 of the outlet plate 650.

The blocking plate 630 and the exhaust hopper 610 are connected with each other by a driving unit 631, and the driving unit 631 functions to move the blocking plate 630 up and down.

Due to the above configuration, the blocking plate 630 is moved up and down relative to the exhaust hopper 610 and the outlet plate 650 according to the operation of the driving unit 631, thereby blocking the exhaust of the exhaust member 600.

To be more specific, when the blocking plate 630 is in a regular position, that is, in the lowered position, the plurality of outlets 651 of the outlet plate 650 and the plurality of exhaust communication holes 633 of the blocking plate 630 are communicated with each other. This is because the plurality of exhaust communication holes 633 is formed in a shape corresponding to the plurality of outlets 651.

Accordingly, when the blocking plate 630 is in the regular position, a fan or the like of the external exhaust unit is actuated and the suction force is generated, whereby the purge gas and the fumes of the wafer W in the storage chamber 100 are exhausted to the external exhaust unit through the plurality of outlets 651, the plurality of exhaust communication holes 633, and the exhaust hole 611.

However, when the blocking plate 630 is in a blocking position, that is, in the lifted position, communication between the plurality of outlets 651 and the plurality of exhaust communication holes 633 is blocked.

This is because a area of the front surface of the blocking plate 630 where the exhaust communication holes 633 are not formed (i.e., a area between the plurality of exhaust communication holes 633) blocks the plurality of outlets 651, thereby blocking the communication between the plurality of outlets 651 and the plurality of exhaust communication holes 633.

Accordingly, although the fan or the like of the external exhaust unit is actuated and the suction force is generated, the purge gas of the storage chamber 100 and the fumes of the wafer W are blocked by the area of the front surface of the blocking plate 630 where the exhaust communication holes 633 are not formed, and the exhaust thereof is blocked.

As described above, the blocking plate 630 blocks the exhaust of the exhaust member 600, thereby having the following advantageous effects.

If the blocking plate 630 is not provided, and a valve or the like provided in the communicating portion with the external exhaust unit is controlled to selectively control the exhaust of the exhaust member 600, the contaminated gas such as the fumes of the wafer W may be mixed inside the storage chamber 100.

To be more specific, while the exhaust is being performed through the exhaust member 600 by the operation of the fan or the like of the external exhaust unit, when the exhaust of the exhaust member 600 is stopped by closing the valve, the purge gas and the fumes of the wafer W are trapped in a space where the exhaust hole 611 and the external exhaust unit are communicated with each other (that is, the passage to the valve of the communication passage between the exhaust hole 611 and the external exhaust unit).

Accordingly, the purge gas and the fumes of the wafer W trapped in the space are mixed with the purge gas injected from the injection member 500 until the exhaust of the exhaust member 600 is performed again by switching the valve to the opened state, and as a result, the inside of the storage chamber 100 may be contaminated.

Further, the fumes of the wafer W, that is, the contaminated gas, remains in the space, and thus, the space is easily contaminated, which causes the problem of replacing the entire exhaust line. However, as described above, when the blocking plate 630 is provided in the exhaust member 600, the blocking plate 630 blocks the storage chamber 100 and the exhaust line themselves, whereby it is possible to achieve exhaust blockage of the exhaust member 600 even more quickly as well as preventing the contaminated gas from remaining in the above described space.

The above described blocking plate 630 of the exhaust member 600 may block only some areas of the outlets 651 without completely blocking the outlets 651 depending on the position thereof.

In other words, when the blocking plate 630 is lifted to a position slightly lower than the above described lifted position, some areas of the outlets 651 are blocked by the area of the front surface of the blocking plate 630 where the exhaust communication holes 633 are not formed (i.e., the area between the plurality of exhaust communication holes 633), but the remaining areas of the outlets 651 still communicate with the exhaust communication holes 633.

Accordingly, the exhaust can be performed by the communication between the outlets 651 and the exhaust communication holes 633, but since the communication area of the outlets 651 is reduced, the exhaust power is weaker than when the outlets 651 and the exhaust communication holes 633 are completely communicated with each other.

As such, by adjusting the lifted position of the blocking plate 630, i.e., the lifted height, the communication area between the outlets 651 and the exhaust communication holes 633, that is, the opening area of the outlets 651, can be adjusted to control the exhaust power of the exhaust member 600 as desired.

Of course, the exhaust member 600 may be disposed on the left rear surface of the circumferential surface of the storage chamber 100, depending on the use, size, etc. of the wafer storage container 10.

Further, although in the above description, the blocking plate 630 of the exhaust member 600 is moved up and down by the driving unit 631 to block the exhaust of the exhaust member 600, the exhaust of the exhaust member 600 may be blocked by lateral slide movement, rotation, or the like depending on the use, size, etc. of the wafer storage container 10.

Further, the above blocking plate 630 may be provided between the injection members 500, that is, between the rear surfaces of the front right injection member 500, the left front injection member 500LF, and the middle rear injection member 500MR, and the purge gas injection of the injection member 500 may be blocked by the above described configuration and function.

Purge Gas Flow of Wafer Storage Container 10

Hereinbelow, reference will be made to the purge gas flow of the wafer storage container 10 configured as described above.

Firstly, reference will be made to the flow of the purge gas injected into the storage chamber 100 through the injection members 500, that is, the left front injection member 500LF, the right front injection member 500RF, and the middle rear injection member 500MR.

When the purge gas is supplied from the external supply unit of the wafer storage container 10, the supplied purge gas is introduced in the bottom plate 300 through the supply hole 311 of the bottom plate 300.

In this case, as shown in FIG. 4, the purge gas flowed to the left-right bottom area supply hole 311B of the supply holes 311 flows by being divided into the bottom area communication hole 511B of the inlet plate 510 of the left front injection member 500LF, and the bottom area communication hole 511B of the inlet plate 510 of the right front injection member 500RF through the left-right bottom area supply flow path 331B.

Further, the purge gas flowed to the left-right middle area supply hole 311M of the supply holes 311 flows by being divided into the middle area communication hole 511M of the inlet plate 510 of the left front injection member 500LF, and the middle area communication hole 511M of the inlet plate 510 of the right front injection member 500RF through the left-right middle area supply flow path 331M.

Further, the purge gas flowed to the left-right top area supply hole 311T of the supply holes 311 flows by being divided into the top area communication hole 511T of the inlet plate 510 of the left front injection member 500LF, and the top area communication hole 511T of the inlet plate 510 of the right front injection member 500RF through the left-right top area supply flow path 331T.

The purge gas flowed to the bottom area communication hole 511B of the inlet plate 510 of the left front injection member 500LF flows to the bottom area inlet hole 513B through the internal flow path, the purge gas flowed to the middle area communication hole 511M flows to the middle area inlet hole 513M through the internal flow path, and the purge gas flowed to the top area communication hole 511T flows to the top area inlet hole 513T through the internal flow path.

As described above, the purge gas flowed respectively to the bottom area inlet hole 513B, the middle area inlet hole 513M, the top area inlet hole 513T of the left front injection member 500LF is introduced into the second injection plate 550*b* provided in the left front injection member 500LF. In other words, of the second injection plates 550*b* of the plurality of injection plates 550, the purge gas is introduced into the second side holes 552*a* of the second injection plates 550*b* communicating with the bottom area inlet hole 513B, the middle area inlet hole 513M, and the top area inlet hole 513T, respectively.

The purge gas introduced into the second side holes 552*a* of the second injection plates 550*b* provided in the left front injection member 500LF flows along the injection chamber formed by the first side flow path 551*a* of the second injection plate 550*b* and the main flow path 552*b* of the first injection plate 550*a*, then as shown in FIG. 9, flows via the main flow path 552*b*, and the continuous branch flow path 553*b*, and is injected into the storage chamber 100 through the injection holes 554*b*. In this case, the purge gas is injected in a direction from the left front of the storage chamber 100 toward inside the storage chamber 100.

The purge gas flow of the left front injection member 500LF described above can also be applied to the purge gas flow of the right front injection member 500RF.

The purge gas flowed to the bottom area communication hole 511B of the inlet plate 510 of the right front injection member 500RF flows to the bottom area inlet hole 513B through the internal flow path, the purge gas flowed to the middle area communication hole 511M flows to the middle area inlet hole 513M through the internal flow path, and the purge gas flowed to the top area communication hole 511T flows to the top area inlet hole 513T through the internal flow path.

As described above, the purge gas flowed respectively to the bottom area inlet hole 513B, the middle area inlet hole 513M, the top area inlet hole 513T of the right front injection member 500RF is introduced into the second injection plate 550*b* provided in the right front injection member 500RF. In other words, of the second injection plates 550*b* of the plurality of injection plates 550, the purge gas is introduced into the second side holes 552*a* of the second injection plates 550*b* communicating with the bottom area inlet hole 513B, the middle area inlet hole 513M, and the top area inlet hole 513T, respectively.

The purge gas introduced into the second side holes 552*a* of the second injection plates 550*b* provided in the right front injection member 500RF flows along the injection chamber formed by the first side flow path 551*a* of the second injection plate 550*b* and the main flow path 552*b* of the first injection plate 550*a*, then as shown in FIG. 9, flows via the main flow path 552*b*, and the continuous branch flow path 553*b*, and is injected into the storage chamber 100 through the injection holes 554*b*. In this case, the purge gas is injected in a direction from the right front of the storage chamber 100 toward inside the storage chamber 100.

The purge gas flowed to the bottom area communication hole 511B of the inlet plate 510 of the middle rear injection member 500MR flows to the bottom area inlet hole 513B through the internal flow path, the purge gas flowed to the middle area communication hole 511M flows to the middle area inlet hole 513M through the internal flow path, and the purge gas flowed to the top area communication hole 511T flows to the top area inlet hole 513T through the internal flow path.

As described above, the purge gas flowed respectively to the bottom area inlet hole 513B, the middle area inlet hole 513M, the top area inlet hole 513T of the middle rear injection member 500MR is introduced into the second injection plate 550*b* provided in the right front injection member 500RF. In other words, of the second injection plates 550*b* of the plurality of injection plates 550, the purge gas is introduced into the second side holes 552*a* of the second injection plates 550*b* communicating with the bottom area inlet hole 513B, the middle area inlet hole 513M, and the top area inlet hole 513T, respectively.

The purge gas introduced into the second side holes 552*a* of the second injection plates 550*b* provided in the middle rear injection member 500MR flows along the injection chamber formed by the first side flow path 551*a* of the second injection plate 550*b* and the main flow path 552*b* of the first injection plate 550*a*, then as shown in FIG. 9, flows via the main flow path 552*b*, and the continuous branch flow path 553*b*, and is injected into the storage chamber 100 through the injection holes 554*b*. In this case, the purge gas is injected in a direction from the middle rear of the storage chamber 100 toward inside the storage chamber 100.

The above described left front injection member 500LF, right front injection member 500RF and the middle rear injection member 500MR, that is, the injection member 500 is configured such that the supply hole 311 and the supply flow path 331 of the bottom plate 300, the communication hole 511 and the inlet hole 513 of the inlet plate 510 of each injection member 500 are divided into lower area, the middle area, and the upper area, and also the multiple injection plates 550 are provided in the injection member 500 in the vertical direction thereof, whereby when the purge gas is injected into the storage chamber 100, three purging areas are formed in the storage chamber 100 as the lower area, the middle area, and the upper area.

To be more specific, as shown in FIG. 6, since of the nine injection plates 550, the first to fourth injection plates 550 from the bottom toward the top communicate with the bottom area inlet holes 513B, respectively, when the purge gas is injected through the injection holes 554b of the first to fourth injection plates 550, the lower area into which the purge gas is injected is formed inside the storage chamber 100.

Further, since of the nine injection plates 550, the fifth to eighth injection plates 550 from the bottom toward the top communicate with the middle area inlet holes 513M, respectively, when the purge gas is injected through the injection holes 554b of the fifth to eighth injection plates 550, the middle area into which the purge gas is injected is formed inside the storage chamber 100.

Since of the nine injection plates 550, the ninth, that is, the uppermost injection plate 550 communicates with the top area inlet hole 513T, when the purge gas is injected through the injection hole 554b of the ninth injection plate 550, the upper area into which the purge gas is injected is formed inside the storage chamber 100.

As such, the purge gas introduced in each of the left front injection member 500LF, the right front injection member 500RF, and the middle rear injection member 500MR is introduced in the storage chamber 100 through the injection holes 554b formed in the plurality of injection plates 550, and since the plurality of injection plates 550 are arranged on top of each other on the seat portion 532 of the wall plate 530 of the injection member 500, the purge gas injected into the storage chamber 100 through the injection holes 554b formed in the plurality of injection plates 550 is injected into the lower area, the middle area, and the upper area inside the storage chamber 100, that is, three purging areas in the vertical direction.

Due to the above described configuration, the wafer storage container 10 according to the preferred embodiment of the present invention is configured such that the injection member 500 injects the purge gas while forming the three purging areas within the storage chamber 100, whereby the flow velocity of the purge gas supplied from the external supply unit can be maintained more than the chamber-type injection member of the conventional wafer storage container. Accordingly, the injection velocity of the purge gas injected from the injection holes becomes higher than that of the conventional wafer storage container, thereby suppressing the occurrence of the dead zone within the storage chamber 100.

Further, only by selectively blocking the flow paths connected to the three purging areas, that is, only by selectively blocking the flow paths flowing through the supply hole of the bottom plate 300, it is possible to achieve purge gas injection only in a desired area within the storage chamber 100, thereby easily controlling the purging of the three purging areas within the storage chamber 100.

In other words, when a valve is provided in the external supply unit and the valve controls the flow of the purge gas flowing through the left-right bottom area supply hole 311B, the left-right middle area supply hole 311M, and the left-right top area supply hole 311T, it is possible to easily control the purging of the lower area, the middle area, and the upper area inside the storage chamber 100.

Meanwhile, unlike the above description, purging area may be divided into more than the three purging areas, i.e., the lower area, the middle area, and the upper area, may be divided into further purging areas.

As described above, the wafer storage container 10 according to the preferred embodiment of the present invention can achieve purge gas injection control in the up and down direction, that is, the vertical direction inside the storage chamber 100.

Further, the purge gas supply to the left front injection member 500LF and the right front injection member 500RF is performed by the left-right bottom area supply flow path 331B, the left-right middle area supply flow path 331M, and the left-right top area supply flow path 331T of the bottom plate 300, and the purge gas supply to the middle rear injection member 500MR is performed by the rear bottom area supply flow path 331B, the rear middle area supply flow path 331M, and the rear top area supply flow path 331T of the bottom plate 300, whereby it is possible to achieve the equivalent injection quantity of the purge gas within the storage chamber 100.

To be more specific, assuming that the flow rate of the purge gas to be supplied from the external supply unit to each of the left-right bottom area supply flow path 331B, the left-right middle area supply flow path 331M, and the left-right top area supply flow path 331T through the left-right bottom area supply hole 311B, the left-right middle area supply hole 311M, and the left-right top area supply hole 311T is '2'.

In this case, the flow rate of the purge gas introduced in the left front injection member 500LF and the right front injection member 500RF through the left-right bottom area supply flow path 331B, the left-right middle area supply flow path 331M, and the left-right top area supply flow path 331T is '1' each (because the left-right bottom area supply flow path 331B, the left-right middle area supply flow path 331M, and the left-right top area supply flow path 331T are branched).

Accordingly, when the flow rate of the purge gas to be supplied from the external supply unit to the rear bottom area supply flow path 333B, the rear middle area supply flow path 333M, and the rear top area supply flow path 333T through the rear bottom area supply hole 313B, the rear middle area supply hole 313M, and the rear top area supply hole 313T is adjusted to '1', the flow rate of the purge gas introduced in the middle rear injection member 500MR can be adjusted to '1'.

Accordingly, as described above, by adjusting the flow rate of the purge gas supplied from the external supply unit to the left-right supply flow path, and the rear supply flow path of the supply flow path 331 of the bottom plate 300, the flow rate of the purge gas introduced in the injection member 500 can be equally adjusted, and as a result, the flow rate of the purge gas injected into the storage chamber 100 can be equally adjusted.

As such, the flow rate of the purge gas injected into the storage chamber 100 is equally adjusted, whereby the flow of the purge gas inside the storage chamber 100 can be smoothly performed, thereby minimizing the occurrence of turbulence due to the bias of the purge gas toward one side.

The description of the flow of the purge gas in the storage chamber 100 and the fumes of the wafer W exhausted through the exhaust member 600 is omitted because it has already been described in the description of the exhaust member 600.

As such, the flow of the purge gas of the wafer storage container 10 according to the preferred embodiment of the present invention, as shown in FIG. 12, is injected from the front left surface, the front right surface, and the middle rear surface of the circumferential surface of the storage chamber 100 by the left front injection member 500LF, the front right injection member 500, and the middle rear injection member 500MR; and the purge gas and the fumes of the wafer W are exhausted to the rear left surface of the circumferential surface of the storage chamber 100 by the exhaust member 600.

Accordingly, purging of the wafer W can be performed without dead zone where the fumes of the wafer W are not removed, and thus, the fumes generated through the wafer W fabrication processes can be uniformly removed.

Further, as described above, by operating the blocking plate 630 of the exhaust member 600, the exhaust of the exhaust member 600 can be blocked, and in this case, the purge gas is injected to fully fill the storage chamber 100, the humidity inside the storage chamber 100 can be lowered through the purge gas, thereby achieving moisture removal of the wafer W.

In addition, as described above, when the wafer storage container 10 controls the humidity inside the storage chamber 100, the heater 517 may help the humidity control by heating the interior of the storage chamber 100, thereby increasing the efficiency of humidity control.

The injection member 500, that is, the left front injection member 500LF, the front right injection member 500, and the middle rear injection member 500MR may have other modifications.

Accordingly, reference will be made to the first modification of the injection member, hereinbelow.

Herein, an injection member 500' according to the first modification is also be described on the basis of a left front injection member 500'LF, which can also be applied to other injection members, that is, a right front injection member 500'RF and a middle rear injection member 500'MR.

Further, in the description of the injection member 500, the redundant description is omitted, and the redundant description is replaced with the description above.

Accordingly, the same parts as those of the above described injection member 500 are represented by the same reference numerals, and the modified parts are denoted by adding ' to the reference numerals.

Injection Member 500' According to First Modification

Hereinbelow, referring to FIGS. 13 to 16, reference will be made to the injection member 500' according to the first modification, that is, the left front injection member 500'LF, the right front injection member 500'RF, and the middle rear injection member 500'MR applicable to the wafer storage container 10 according to the preferred embodiment of the present invention.

However, in the following description, a plurality of injection holes 554'b are divided into a small injection hole 554'bS (554'b small), a regular injection hole 554'bR (554'b regular), and a large injection hole 554'bL (554'b large) according to the opening area. In this case, the ratio of opening area between the small injection hole 554'bS, the regular injection hole 554'bR, and the large injection hole 554'bL is '1:2:4'.

Figure 13A:
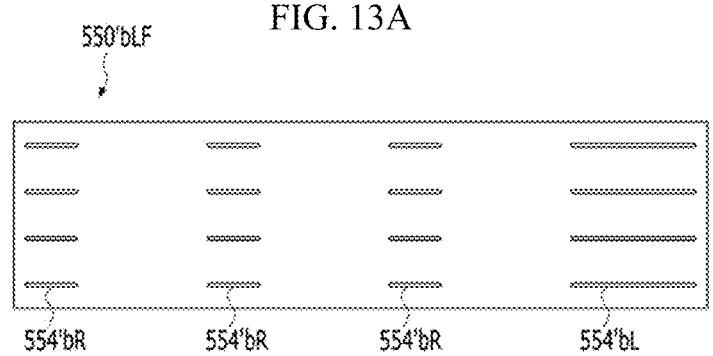
FIG. 13A is a view showing a front surface of a second injection plate of a left front injection member according to a first modification.
Figure 13B:
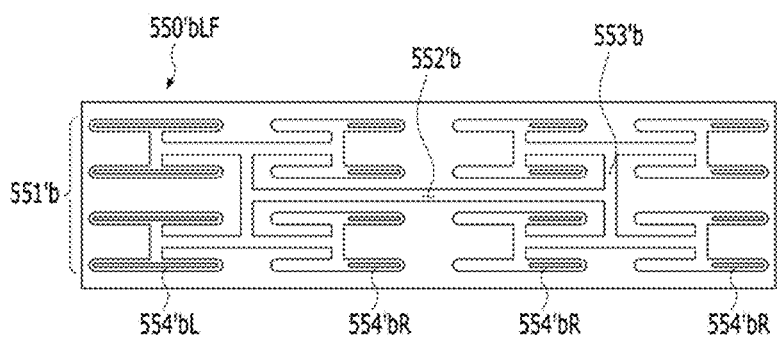
FIG. 13B is a view showing a rear surface of the second injection plate of the left front injection member according to the first modification.
Figure 14A:
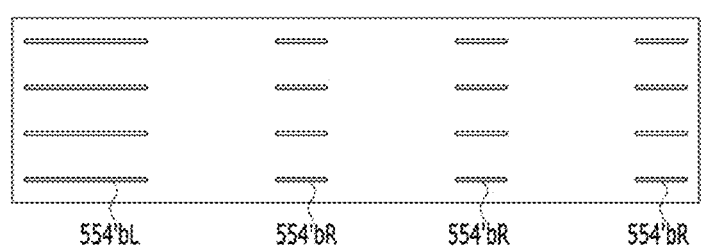
FIG. 14A is a view showing a front surface of a second injection plate of a right front injection member according to the first modification.
Figure 14B:
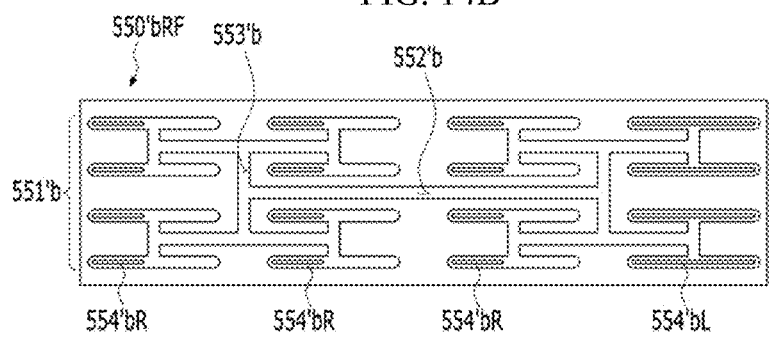
FIG. 14B is a view showing a rear surface of the second injection plate of the right front injection member according to the first modification.
Figure 15A:
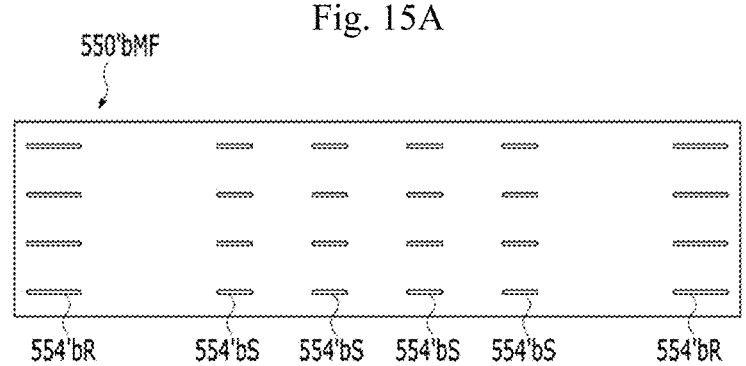
FIG. 15A is a view showing a front surface of a second injection plate of a rear injection member according to the first modification.
Figure 15B:
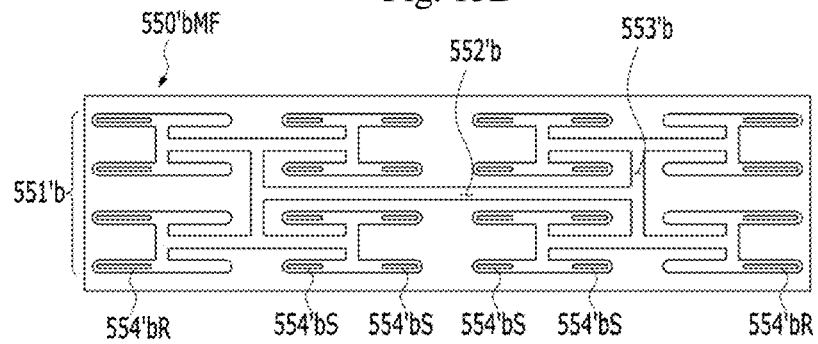
FIG. 15B is a view showing a rear surface of the second injection plate of the middle rear injection member according to the first modification.
Figure 16:
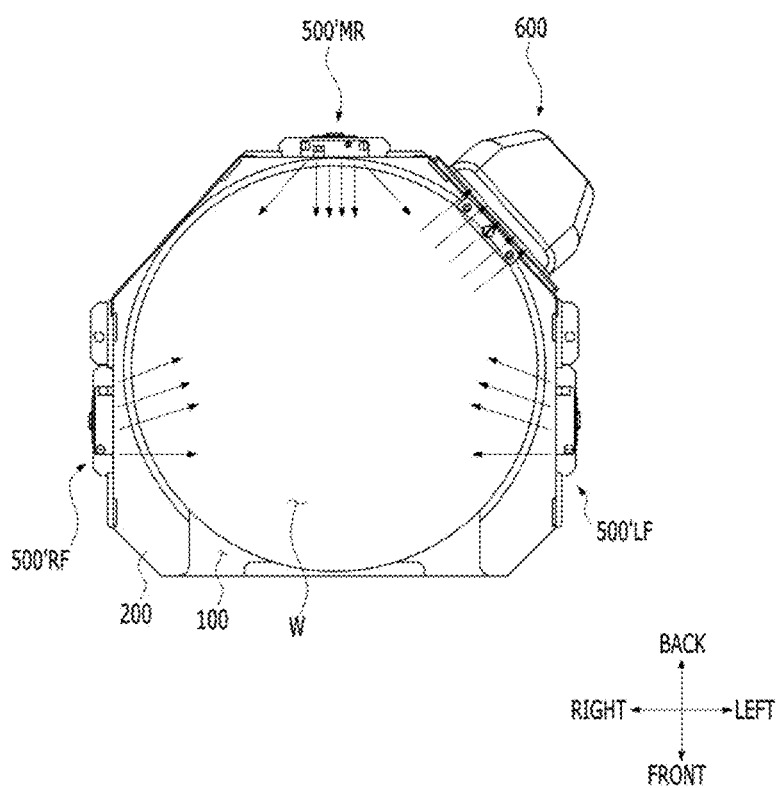
FIG. 16 is a view showing a flow of purge gas injected to a wafer supported by a support of the wafer storage container provided with the injection members according to the first modification, and a flow of purge gas and fumes exhausted to the exhaust member.

FIG. 13A is a view showing a front surface of a second injection plate of a left front injection member according to a first modification; FIG. 13B is a view showing a rear surface of the second injection plate of the left front injection member according to the first modification; FIG. 14A is a view showing a front surface of a second injection plate of a right front injection member according to the first modification; FIG. 14B is a view showing a rear surface of the second injection plate of the right front injection member according to the first modification; FIG. 15A is a view showing a front surface of a second injection plate of a rear injection member according to the first modification; FIG. 15B is a view showing a rear surface of the second injection plate of the middle rear injection member according to the first modification; and FIG. 16 is a view showing a flow of purge gas injected to a wafer supported by a support of the wafer storage container provided with the injection members according to the first modification, and a flow of purge gas and fumes exhausted to the exhaust member.

The injection member 500' according to the first modification, that is, each of the left front injection member 500'LF, the right front injection member 500'RF, and the middle rear injection member 500'MR includes: the inlet plate 510 provided with the communication hole 511 communicating with the supply flow path 331 of the bottom plate 300, and the internal flow path communicating with the communication hole 511 such that the purge gas is introduced therein; the wall plate 530 coupled to the first side of the inlet plate 510; and a plurality of injection plates 550' coupled to the first side of the wall plate 530, and provided with injection holes 554'b for injecting the purge gas supplied from the internal flow path into the storage chamber 100.

In this case, the left front injection member 500'LF, the right front injection member 500'RF, and the middle rear injection member 500'MR according to the first modification are different from the left front injection member 500LF, the right front injection member 500RF, and the middle rear injection member 500MR of the wafer storage container 10 according to the preferred embodiment of the present invention only in the shape of the injection holes 554b formed in the second injection plate 550b of the injection plate 550 respectively provided in the left front injection member 500LF, the right front injection member 500RF, and the middle rear injection member 500MR, and the other parts are the same (of course, the arrangement positions are different from each other), and thus redundant description is omitted.

In other words, it is understood that the left front injection member 500'LF, the right front injection member 500'RF, and the middle rear injection member 500'MR according to the first modification are the injection member 500' configured by modifying only the shape of the injection holes 554'b.

Firstly, reference will be made to a shape of the injection holes 554'b of a second injection plate 550'bLF of the left front injection member 500'LF.

Based on FIG. 13A, the injection holes 554'b corresponding to the first to third columns of the plurality of injection holes 554'b of the second injection plate 550'bLF are formed into the regular injection holes 554'bR, and the injection holes 554'b corresponding to the fourth column are formed into the large injection holes 554'bL.

In this case, the regular injection holes 554'bR, as shown in FIG. 13B, is configured such that 'I' shaped end portions, where the purge gas reaches last in the continuous branch flow path 553'b, are open only in the one side (the right side based on FIG. 13B).

Further, the large injection holes 554′bL, as shown in FIG. 13B, is configured such that all the 'I' shaped end portions, where the purge gas reaches last in the continuous branch flow path 553′b, are open.

Hereinbelow, reference will be made to a shape of the injection holes 554′b of a second injection plate 550′bRF of the right front injection member 500′RF.

Based on FIG. 14A, the injection holes 554′b corresponding to the second to fourth columns of the plurality of injection holes 554′b of the second injection plate 550′bRF are formed into the regular injection holes 554′bR, and the injection holes 554′b corresponding to the first column are formed into the large injection holes 554′bL.

In this case, the regular injection holes 554′bR, as shown in FIG. 14B, is configured such that 'I' shaped end portions, where the purge gas reaches last in the continuous branch flow path 553′b, are open only in the one side (the left side based on FIG. 14B).

Further, the large injection holes 554′bL, as shown in FIG. 14B, is configured such that all the 'I' shaped end portions, where the purge gas reaches last in the continuous branch flow path 553′b, are open.

Hereinbelow, reference will be made to a shape of the injection holes 554′b of a second injection plate 550′bMR of the middle rear injection member 500′MR.

Based on FIG. 15A, the injection holes 554′b corresponding to the first and sixth columns of the plurality of injection holes 554′b of the second injection plate 550′bMR are formed into the regular injection holes 554′bR, and the injection holes 554′b corresponding to the second to fifth columns are formed into the small injection holes 554′bS.

In this case, the regular injection holes 554′bR, as shown in FIG. 15B, is configured such that 'I' shaped end portions, where the purge gas reaches last in the continuous branch flow path 553′b, are open only in the one side (the left or right side based on FIG. 15B).

Further, the small injection holes 554′bS, as shown in FIG. 15B, is configured such that 'I' shaped end portions, where the purge gas reaches last in the continuous branch flow path 553′b, are half open at opposite sides thereof (each of the opposite sides being open by half of the opening area of the above described regular injection holes 554′bR).

Hereinbelow, reference will be made to the flow of the purge gas injected through the injection member 500′ according to the first modification with reference to FIG. 16.

Herein, as described above, since the ratio of opening area between the small injection hole 554′bS, the regular injection hole 554′bR, and the large injection hole 554′bL is '1:2:4', the ratio of injection quantity of the purge gas injected through each of the small injection hole 554′bS, the regular injection hole 554′bR, and the large injection hole 554′bL is also '1:2:4'.

The purge gas injected through the large injection holes 554′bL disposed in the first column of the second injection plate 550′bLF of the left front injection member 500′LF and in the fourth column of the second injection plate 550′bRF of the right front injection member 500′RF is injected straight toward the wafer W.

The purge gas injected through the regular injection holes 554′bR disposed in the second to fourth columns of the second injection plate 550′bLF of the left front injection member 500′LF and in the second to fourth columns of the second injection plate 550′bRF of the right front injection member 500′RF is injected obliquely in the backward direction of the storage chamber 100. This is because the regular injection holes 554′bR are formed only at one side of the 'I' shaped end portions of the branch flow path portion 551′b, so that a slope is generated in the purge gas flow.

The purge gas injected through the regular injection holes 554′bR disposed in the first and sixth columns of the second injection plate 550′bMR of the middle rear injection member 500′MR is injected obliquely in the left front direction and the right rear direction of the storage chamber 100, respectively, and the purge gas injected through the small injection holes 554′bS disposed in the second to fifth columns of the second injection plate 550′bMR of the middle rear injection member 500′MR is injected straight toward the wafer W.

As described above, the purge gas injected through the regular injection holes 554′bR disposed in the second to fourth columns of the second injection plate 550′bLF of the left front injection member 500′LF and in the second to fourth columns of the second injection plate 550′bRF of the right front injection member 500′RF, and the purge gas injected through the regular injection holes 554′bR disposed in the first and sixth columns of the second injection plate 550′bMR of the middle rear injection member 500′MR are injected and flows in the left rear direction and the right rear direction of the upper surface of the wafer W to cover the dead zone of the wafer W (compare with FIG. 12).

In other words, as shown in FIG. 16, the purge gas is injected from the opposite sides of the middle rear injection member 500′MR, that is, the left and right sides thereof, in the left and right directions, and the purge gas is injected from each of the left front injection member 500′LF and the right front injection member 500′RF in the rearward direction, whereby the flow of the purge gas on the left rear surface and the right rear surface of the storage chamber 100 where the injection member 500′ is not disposed can be covered, and thus, it is possible to minimize the occurrence of the dead zone on the left rear surface and the right rear surface of the storage chamber 100.

Further, in view of the ratio of the opening area of the above described injection holes 554′b, the flow rate of the purge gas injected through the large injection holes 554′bL disposed in the first column of the second injection plate 550′bLF of the left front injection member 500′LF and in the fourth column of the second injection plate 550′bRF of the right front injection member 500′RF is '4', so a large amount of purge gas is injected in the direction of the front opening 110 of the storage chamber 100, and thus, external gas can be prevented from being introduced into the storage chamber 100.

Further, the purge gas injected through the regular injection holes 554′bR disposed in the first and sixth columns of the second injection plate 550′bMR of the middle rear injection member 500′MR is injected obliquely in the left front direction and the right rear direction of the storage chamber 100, respectively, and the flow rate thereof is '2', and thus, when the purge gas and the fumes are exhausted through the exhaust member 600, the flow of purge gas helps the exhaust of the purge gas and the fumes, thereby achieving the smooth purging of the wafer storage container.

As described above, according to the first modification, the shapes of the injection holes 554′b of the injection members 500′ are formed to be different as the small injection holes 554′bS, the regular injection holes 554′bR, and the large injection holes 554′bL to control the injection direction and the flow rate of the purge gas, thereby controlling the flow of purge gas in the storage chamber 100, and thus, it is possible to minimize the occurrence of dead zone in which the fumes of the wafer W cannot be removed, while achieving airflow formation in the storage chamber 100.

Of course, depending on the position of the injection member disposed in the wafer storage container 10, unlike the injection member 500' according to the first modification, the positions and opening areas of the injection holes may be modified to achieve an optimized purge gas flow within the storage chamber 100 to be suitable for the arrangement of the injection member of the wafer storage container 10.

As described above, although described with reference to the exemplary embodiment of the present invention and the first modification of the injection member, those skilled in the art will appreciate that various modifications or changes are possible, without departing from the scope and spirit of the invention as disclosed in the accompanying claims.

What is claimed is:

1. A wafer storage container comprising:
   a storage chamber configured such that a wafer is stored therein through a front opening; and
   an injection member provided on at least a part of a circumferential surface of the storage chamber to inject purge gas into the storage chamber,
   wherein the injection member includes:
   an inlet plate provided with an internal flow path with the purge gas introduced therein;
   a wall plate coupled to a first side of the inlet plate; and
   a plurality of injection plates coupled to a first side of the wall plate, and provided with injection holes to inject the purge gas supplied from the internal flow path into the storage chamber,
   wherein the wall plate includes:
   a wall portion constituting at least a part of the circumferential surface of the storage chamber; and
   a seat portion formed recessed toward a second side of the wall portion,
   wherein the plurality of injection plates are seated in and coupled to the seat portion.

2. The wafer storage container of claim 1, wherein the plurality of injection plates are seated in the seat portion to be arranged on top of each other.

3. The wafer storage container of claim 1, wherein a recess depth of the seat portion is equal to a thickness of the injection plate.

4. The wafer storage container of claim 1, wherein each of the plurality of injection plates is configured such that a first injection plate coupled to a first side of the seat portion and provided with a first side flow path through which the purge gas supplied from the internal flow path flows, and a second injection plate coupled to a first side of the first injection plate and formed with the injection holes communicating with the internal flow path are coupled to each other.

5. The wafer storage container of claim 1, wherein the inlet plate is provided with an inlet portion protruding toward the first side of the inlet plate,
   the inlet portion is provided with an inlet hole communicating with the internal flow path, and
   the inlet portion is inserted into an inlet portion hole formed in the seat portion.

6. The wafer storage container of claim 1, wherein the inlet plate is provided with a heater to heat the purge gas flowing through the internal flow path.

\* \* \* \* \*